United States Patent
Li et al.

(10) Patent No.: US 6,502,588 B2
(45) Date of Patent: Jan. 7, 2003

(54) SURFACE MODIFICATION USING AN ATMOSPHERIC PRESSURE GLOW DISCHARGE PLASMA SOURCE

(75) Inventors: Kin Li, Bellevue, WA (US); Minas Tanielian, Bellevue, WA (US)

(73) Assignee: The Boeing Company, Seattle, WA (US)

( * ) Notice: Subject to any disclaimer, the term of this patent is extended or adjusted under 35 U.S.C. 154(b) by 0 days.

(21) Appl. No.: 09/732,424

(22) Filed: Dec. 7, 2000

(65) Prior Publication Data

US 2001/0000206 A1 Apr. 12, 2001

Related U.S. Application Data

(62) Division of application No. 09/206,777, filed on Dec. 7, 1998, now Pat. No. 6,221,268, which is a division of application No. 08/632,254, filed on Apr. 15, 1996, now Pat. No. 5,928,527.

(51) Int. Cl.$^7$ .............................. C25F 1/00; B08B 6/00
(52) U.S. Cl. ........................ 134/1.1; 216/67; 216/24; 438/710; 438/725
(58) Field of Search .................. 216/24, 67; 385/147; 438/710, 725; 134/1.1

(56) References Cited

U.S. PATENT DOCUMENTS

| | | | | |
|---|---|---|---|---|
| 5,221,427 A | * | 6/1993 | Koinuma et al. | 156/345 |
| 5,938,854 A | * | 8/1999 | Roth | 134/1 |
| 6,004,631 A | * | 12/1999 | Mori | 134/1.2 |

\* cited by examiner

*Primary Examiner*—Gregory Mills
*Assistant Examiner*—Shamim Ahmed
(74) *Attorney, Agent, or Firm*—Conrad O. Gardner

(57) ABSTRACT

A method for producing stable atmospheric pressure glow discharge plasmas using RF excitation and the use of said plasmas for modifying the surface layer of materials. The plasma generated by this process and its surface modification capability depend on the type of gases used and their chemical reactivity. These plasmas can be used for a variety of applications, including etching of organic material from the surface layer of inorganic substrates, as an environmentally benign alternative to industrial cleaning operations which currently employ solvents and degreasers, as a method of stripping paint from surfaces, for the surface modification of composites prior to adhesive bonding operations, for use as a localized etcher of electronic boards and assemblies and in microelectronic fabrication, and for the sterilization of tools used in medical applications.

1 Claim, 5 Drawing Sheets

SURFACE MODIFICATION USING AN ATMOSPHERIC PRESSURE GLOW DISCHARGE PLASMA SOURCE

CROSS-REFERENCE TO RELATED APPLICATIONS

This application is a divisional application of continuation-in-part application Ser. No. 09/206,777, filed Dec. 7, 1998, now U.S. Pat. No. 6,221,268, which is a divisional of prior application Ser. No. 08/632,254 U.S. Pat. No. 5,928,527, filed Apr. 15, 1996.

TECHNICAL FIELD

This invention relates to a method used for the production of atmospheric pressure plasmas of various gaseous mixtures and their usage for the surface modification of materials.

BACKGROUND OF THE INVENTION

Atmospheric pressure plasmas have been known since the dawn of man. A classic example is lightning. These atmospheric plasmas (DC-type) occur when a high potential causes the dielectric breakdown of air (>8 KV/cm in air). This type of plasma is used for producing various types of ceramic coatings in an apparatus known in the industry as a "plasma gun". Most other plasma producing devices do so in a vacuum system. Such vacuum-based systems are widely used in the microelectronics industry both for the deposition of thin films and for various etching and surface modification applications. Most of these vacuum-based plasma generating systems use RF or microwave energy excitation to sustain a stable plasma environment. Whereas a stable plasma is relatively easy to generate and maintain at low pressures it is much harder to do so at ambient pressures, due to the very short mean free paths and large recombination rate of the plasma radicals. Discussions of vacuum-type plasmas are given in "Handbook of plasma processing technology", edited by S. Rossnagel, J. Cuomo, and W. Westwood.

Whereas the capabilities of vacuum-type plasmas are limited by the size of the vacuum chamber and the associated pumping system, an atmospheric pressure plasma system can be configured with very little limitation on the size and shape of the objects treated. It can be made compact and portable as described in our co-pending U.S. application Ser. No. 08/572,390 filed Dec. 14, 1995, details of which are incorporated herein by reference. This system can also be scaled up with very little additional cost either through a large parallel plate configuration or through an array of small orifices, it can be installed in a variety of environments without any facilitation needs and its operating costs and maintenance requirements are minimal.

PRIOR ART PUBLICATIONS

H. Koinuma et al., "*Development and Application of a Microbeam Plasma Generator*" Appl. Phys. Lett. vol. 60, p. 816–817, (1992) K. Inomata, "*Open Air Deposition of $SiO_2$ Film From a Cold Plasma Torch of Tetramethoxysilane-$H_2$—Ar System*" Appl. Phys. Lett., vol. 64, p. 46–48 (1994)

SUMMARY OF THE INVENTION

The present invention relates to a device and a method for producing stable atmospheric pressure glow discharge plasmas using low power RF excitation applied through a tuner to a resonant LC circuit, said resonant circuit having as one of its components a discharge chamber capacitor through which a mixture of gases is passed. In addition, the discharge chamber can be configured so that a magnetic field is provided along the direction of the flowing gases such that it provides a force on the charged species in the plasma region thus increasing the ionization ratio. The magnetic field can be provided either through a set of permanent magnets or a coil attached on the external surface of the discharge chamber. These atmospheric pressure plasmas can be generated in various gases flowing through the discharge chamber, the typical case being a combination of a noble gas such as Helium or Argon and a reactive gas such as Oxygen or Nitrogen. The specific gases used and their respective percentages depend on type of surface modification processing sought such as etching of organic materials, surface modification of composites and polymers, and chemical interactions with surface layers of materials.

It is an object of this invention to provide a source for generating atmospheric pressure glow discharge plasmas which is simple and relatively inexpensive to construct.

Another object of this invention is to provide an atmospheric pressure glow discharge plasma source utilizing a resonant circuit and RF excitation to ionize the gas molecules without the need of a vacuum chamber or pumping systems.

Yet another object of this invention is to enhance the ionization rate of the molecules using a magnetic field extended parallel to the gas flow.

It is also an object of this invention that the ionized gases generated in the discharge chamber be used as a source of reactants for etching organic materials and in general modifying the surface characteristics of material.

These and other objects of the invention will be apparent from the following detailed description of preferred embodiment when read in connection with the appended drawings.

DETAILED DESCRIPTION OF THE INVENTION

There are a number of distinct advantages in the use of the hereinafter described atmospheric pressure plasma as opposed to one in a vacuum chamber. Its compact packaging makes it portable and easily reconfigurable, it eliminates the need for high priced vacuum chambers and pumping systems, it can be scaled up with very little additional cost, it can be installed in a variety of environments without any facilitization needs and its operating costs and maintenance requirements are minimal.

Figure 1A:
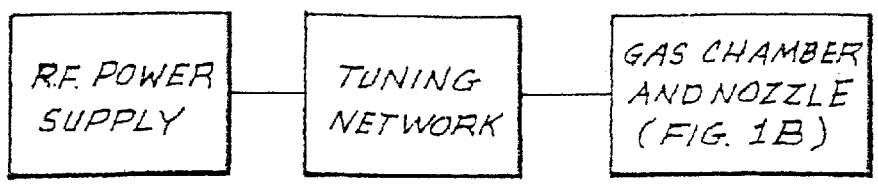
FIG. 1A is a block diagram of an atmospheric glow discharge system utilized in surface modification in accordance with the invention.
Figure 1B:
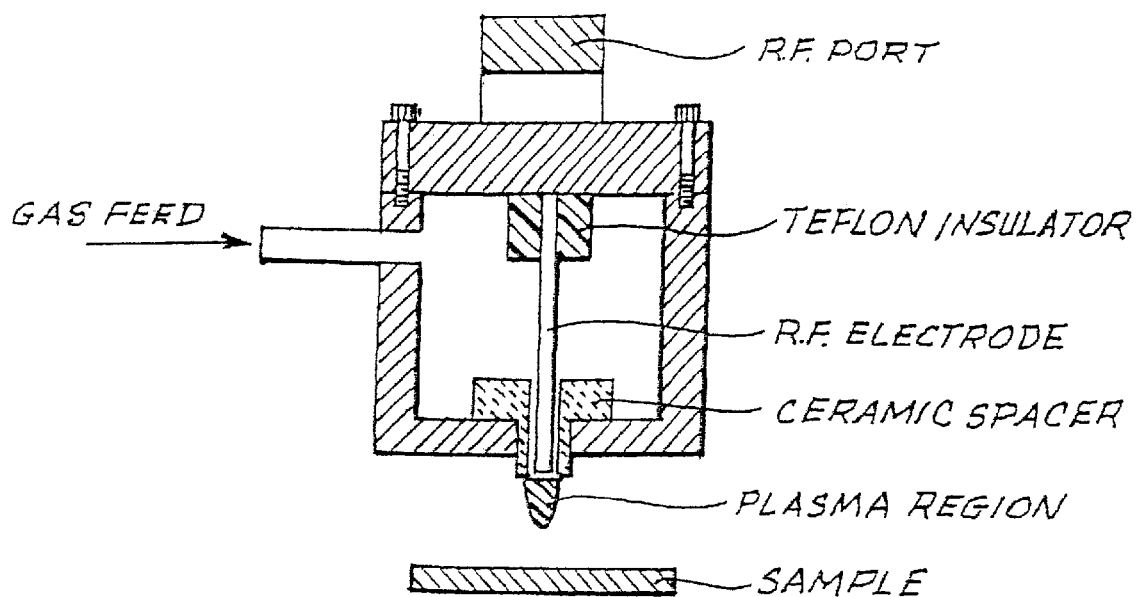
FIG. 1B is a cross sectional view of the gas chamber and nozzle of the atmospheric glow discharge plasma source used in the system of FIG. 1A to effect surface modification in accordance with the invention.

A schematic representation of the present atmospheric pressure glow discharge plasma source utilized in accordance with the hereinafter described method of the present invention is shown in FIG. 1A. FIG. 1B shows the gas chamber and nozzle portion of the system of FIG. 1A and is described in more detail in hereinbefore referenced copending application Ser. No. 08/572,390. The system is comprised of three elements: The RF power supply, the tuning network, and the gas chamber/nozzle. The RF power supply is presently an ordinary power supply used for vacuum, thin film sputtering applications. The RF frequency used is 13.56 MHz, which is the frequency allowed by the F.C.C. (Federal Communications Commission) for industrial applications. The tuning network is necessary to be able to maintain a stable RF plasma at atmospheric pressure. The nozzle configuration is comprised of an inner electrode where the RF power is introduced, a gap where the discharge occurs, a ceramic spacer and the grounded gas chamber as shown in FIG. 1B.

The feed gases are introduced to the annular region where the plasma is generated through the ground shield chamber. Different configurations of the center electrode, the ceramic spacer and the gap will result in different flow patterns. These flow patterns can be tailored to a specific application.

One configuration uses a 1 mm wide annular region as the plasma generation region. This plasma extends to a distance of roughly 3–10 mm in length from the tip of the inner electrode. The typical power used for the plasma is 2–60 Watts. The gas flow can be varied using a gas manifold fitted with mass flow controllers. Even though the gas flow can be varied over a wide range of values the typical flow used is 1000 sccm.

The ability to generate a stable plasma using a variety of gas compositions. Some examples are: Helium, Helium+Oxygen, Argon, Argon+Oxygen, Helium+Nitrogen, and Helium+$CF_4$ has been demonstrated.

COLD ATMOSPHERIC PRESSURE PLASMA APPARATUS AND METHOD OF OPERATION

One major feature of the present atmospheric pressure plasma systems is that the plasma generated is a "cold" one, i.e., less than 100 C. as measured by a thermocouple, and similar to those generated ordinarily in vacuum chambers. The exact temperature of the plasma is a function of several parameters such as power, gas flow, electrode geometry, and distance from the tip of the RF electrode. When the discharge feed gas is an inert gas (He, Ar) the plasma generates a short-lived source of ions of this particular gas which can bombard a surface of interest and change its surface electronic states, by creating broken bonds or altering the surface bonding configurations. A small admixture of a reactive gas in this plasma such as oxygen creates a localized source of atomic oxygen, oxygen radicals, and ozone around the plasma region. The parameters that influence these processes are: RF power, gas flow, electrode geometry, and gas composition.

Figure 2A:
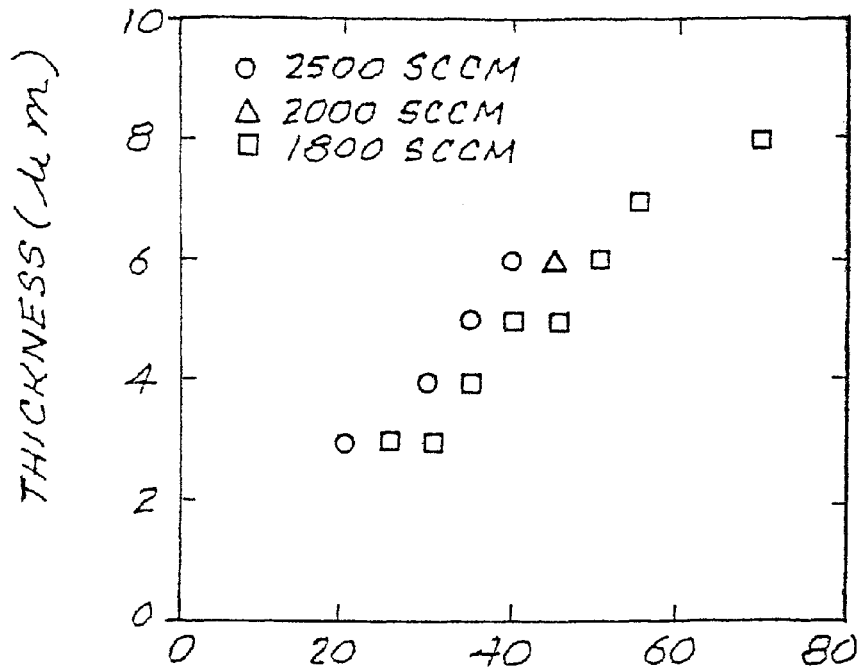
FIG. 2A is a graph illustrative of etch rate vs. power for various gas flows achieved in accordance with the method according to the invention.
Figure 2B:
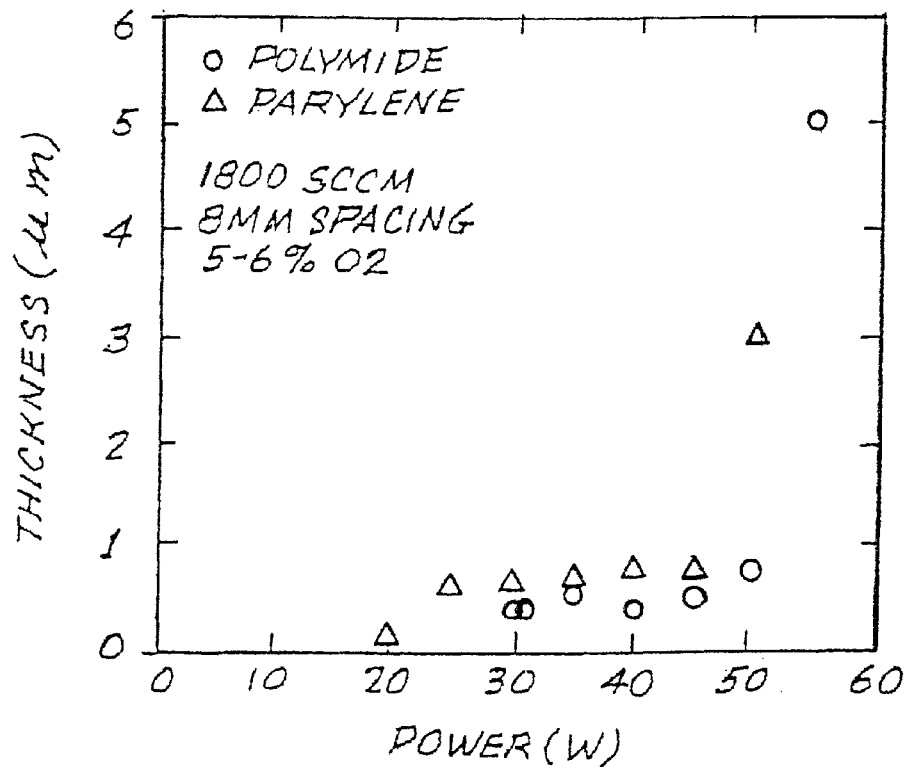
FIG. 2B is a graph illustrative of etch rate vs. power for polyimide and polylene.

According to the present method of surface modification a variety of materials have been exposed to the atomic oxygen plasma source under various plasma parameters. When an organic material is exposed to this process, it reacts with these strong oxidizers and is essentially "etched away". Two representative materials include polyimide, and parylene. Other materials examined include photoresist, grease, machine oil, epoxy, soldering flux, and paints. The size of the glow discharge depends on the power, the gas flow rate, the gas composition, and the geometry. This is shown in FIGS. 2A and 2B.

Figure 3A:
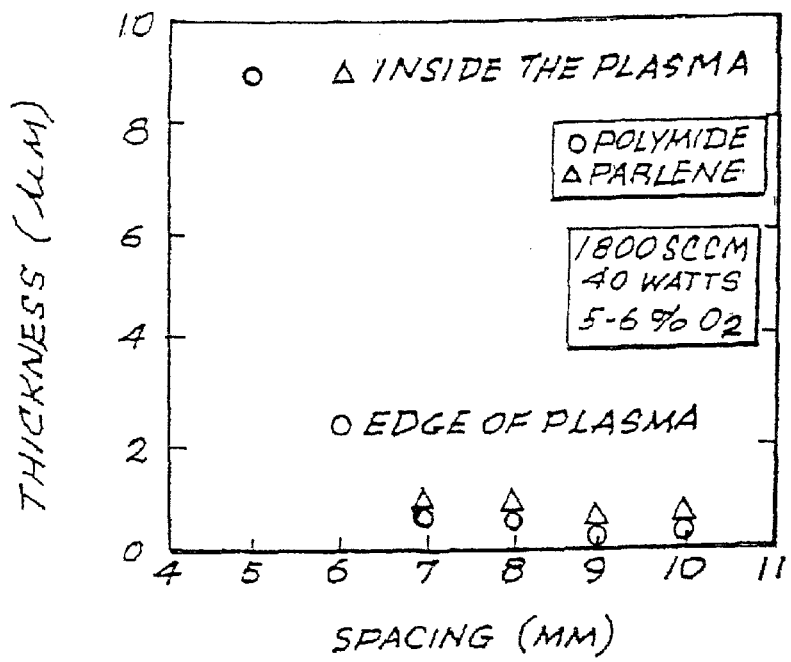
FIG. 3A is a graph illustrative of etch rate vs. spacing distance form tip of the RF electrode shown in FIG. 1B.
Figure 3B:
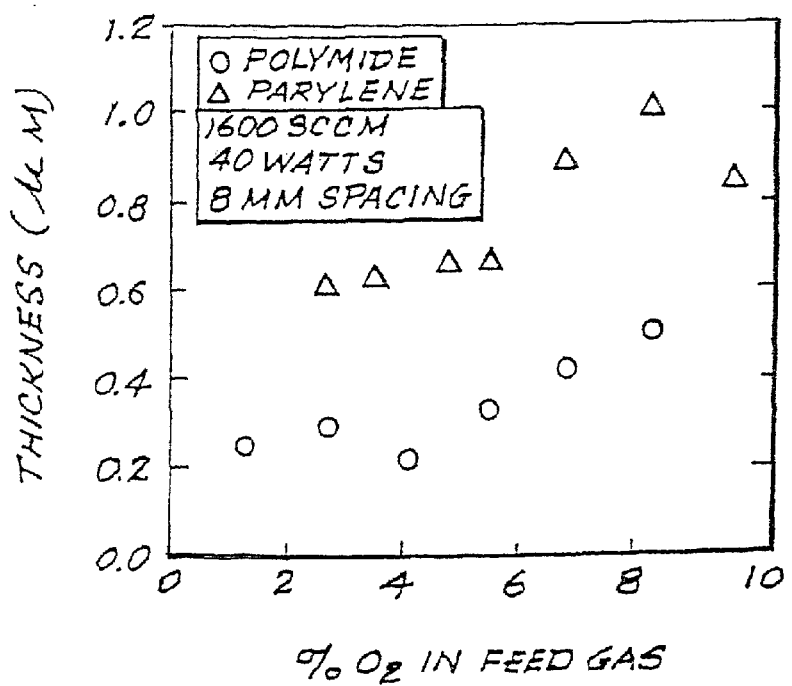
FIG. 3B is a graph illustrative of etch rate vs. percentage of oxygen in the feed gas.

The etch rate also depends on the distance from the plasma glow and the relative percentage of Oxygen in the gas. These are shown in FIGS. 3A and 3B. The distance is measured from the tip of the RF electrode.

APPLICATIONS OF THE COLD ATMOSPHERIC PRESSURE PLASMA APPARATUS

Method of Surface Cleaning Organic Contaminants

Figure 4:
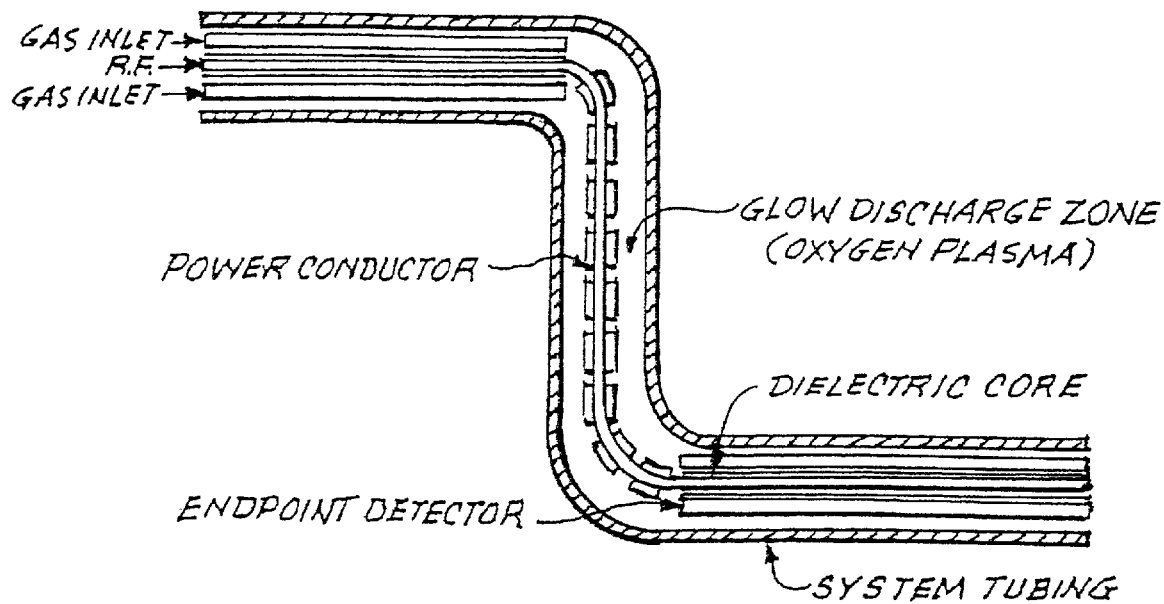
FIG. 4 is a schematic representation of a series of atmospheric pressure glow discharge sources distributed along and concentrically disposed about the center conductor of a coaxial cable.
Figure 5:
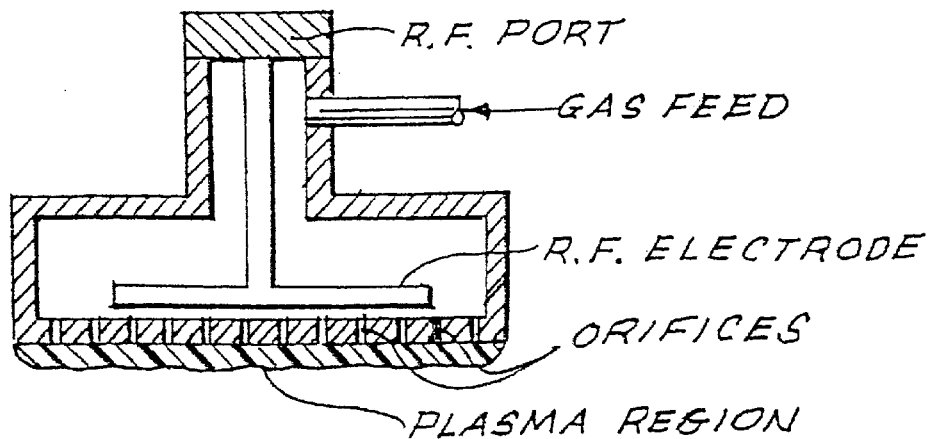
FIG. 5 is a schematic representation of an atmospheric pressure parallel plate RF glow discharge plasma source nozzle; and, FIG. 6 is a diagram showing flame length vs. flowrate.

As hereinbefore mentioned, the present cold atmospheric pressure plasma surface treatment process etches all types of organic compounds, including hydrocarbons. It does not require the use of a vacuum and it can operate over a wide range of parameters which can be optimized for the specific application. Its by-products are gaseous and are most likely oxides of the respective elements the organic material is made of, typically $CO_2$ and water. It can operate in a room environment with a relatively low gas flow. For safety purposes, it may be desirable to operate such a device under a hood or with the attachment of small, localized vacuum pump, if needed. This device will not harm an underlying metallic surface, nor will it etch any oxides such as ceramic materials or glasses. It can be fitted with a fiber optic end-point detector so that no unnecessary processing takes place. Finally, a modified version of the apparatus can be incorporated at a section of an RF cable which will allow for it to be inserted in long, bent tubes or other tight spots for hydrocarbon or other organic contaminant removal by the use of atomic oxygen without the use of vacuum. Such an embodiment is shown in FIG. 4. A schematic representation of a set of these plasma devices fitted in the middle of an RF cable is shown. Parallel tubes bring the reactive gases to the plasma region and are fitted with end-point detectors (fiber). In this embodiment the plasma region would have to be moved slowly through the tube while monitoring the $CO_2$ emissions from the plasma region. The end-point detector is very useful in this embodiment because different regions of the tube may have different degrees of contamination.

An important use of the present cold atmospheric pressure plasma apparatus is in the etching of materials. These include organic coatings or contaminates. A feed gas mixture that contains oxygen will result in the generation of atomic oxygen in the plasma. This atomic oxygen is responsible for the etching. Because of the importance of plasma cleaning, most of the experimentation has involved the removal of organic materials (parylene and polyimide).

Two (2) different feed gas mixtures have been investigated. Argon/Oxygen and Helium/Oxygen. Both of these mixtures result in the generation of atomic oxygen. Helium/Oxygen mixtures that contain less than 3% oxygen are unstable. Argon/Oxygen plasmas exhibit a strong relationship between flame length and the amount of oxygen in the feed gas.

In order to etch a material, the sample needs to be placed close to the discharge. If the sample is placed inside the discharge itself, the etching will occur very rapidly. (See FIG. 3A). However, if the sample is placed inside the discharge electrical arcing from the electrode tip to the sample may occur. This is unacceptable, because arcing can easily damage a sample.

As the power to the plasma is increased, the etch rate increases. This is shown in FIG. 2B. Increasing the power increases both the length of the discharge and the generation of reactive species within the plasma.

Figure 6:
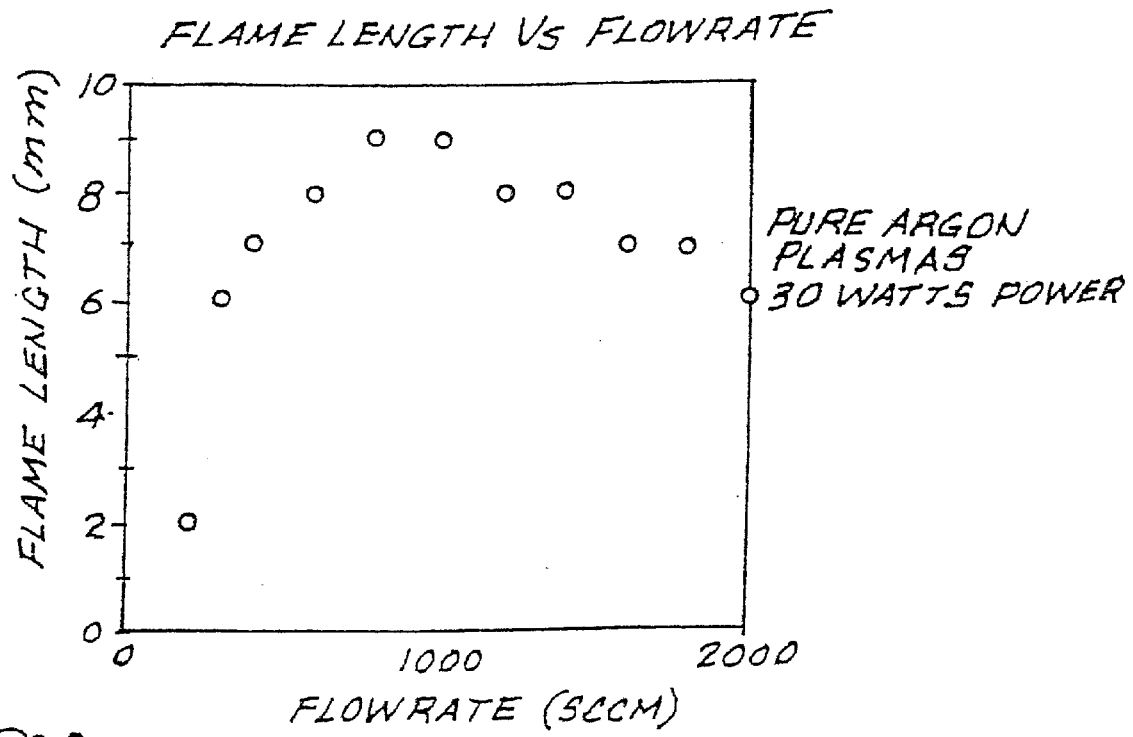

Another way to change the size of the discharge is to change the gas flow rate through the nozzle. (See FIG. 2A). Any plasma species that are generated in the glow discharge are consumed through recombination. A higher gas flow rate will 'push' the species out faster, before they have had a chance to recombine. FIG. 6 shows and optimal flow rate at 1000 sccm for the nozzle shown in FIG. 1B.

Stripping of Paint

Most of the parameter studies were carried out using parylene and polyimide as the organic material. Epoxy and urethane based paints have also been etched from composite and aluminum substrates. The present system is capable of etching the organic binder in the paint formulation, but the inorganic components remain on the surface. They accumulate as a fine powder that appears to be bound electrostatically to the surface of the sample. This powder can easily be wiped off the part using a dry rag. The best way to strip paint with the present system is to etch the part for a period of time (about 5–10 minutes), wipe the residue off with a rag, and then etch the paint some more. (Using this technique, paint can be stripped at a rate of 2000 Angstroms per minute.)

Surface Modification of Composites and Other Organics Prior to Bonding

Exposure to plasmas, especially for insulating materials creates modifications in the surface states present, typically making them more active chemically by the creation of surface charges, broken bonds etc. It is believed that surface treatment with a noble gas plasma or a combination of gases may enhance the bonding of various composites and organic binders, thereby helping to eliminate various toxic chemicals used in such operations.

Electronic Manufacturing

Removal of parylene which is used as an overcoat for the protection of electronic parts in circuit boards has been accomplished. This is necessary if one needs to do any rework/replacement of parts. At present the removal of parylene is extremely difficult and requires some very strong chemicals which attack not only the parylene layer but also the circuit board itself.

A second application involves flux removal from electronic or opto-electronic parts. The etching of various types of flux in localized areas has been demonstrated.

Medical Applications

An oxygen plasma can be used as a means of sterilization of medical/surgical parts without any use of chemicals. This can be done in a localized fashion and without the need of autoclaves or other expensive non-portable equipment.

Other Applications Utilizing the Present Method
Fiber Optic Cables

Fiber optic cables are often coated with a polyimide layer. This layer must be removed for installation of the cable into connector terminals. This can be accomplished through the use of concentrated acids or it can be done using the present apparatus and method. The present system will quickly and safely remove the coating without the generation of any hazardous wastes or the potential of employee exposure to corrosive solutions.

Thick Film Resistors

Manufacturers of printed circuit boards use a screen printed resistor material to fashion resistor on the boards. This material consists of a polymer matrix with graphite particles embedded in it. Conventional trimming techniques do not work for these resistors. Resistors have been trimmed utilizing the present apparatus and method. By slowly removing the material from the device, the value of the resistor can be raised in a controlled fashion.

Comparison With Other Approaches

The present cold atmospheric pressure plasma system and method has a distinct advantage over competing methods such as laser etching because of its very low cost and its ability to be scaled up without any loss in throughput. For example, laser etching can increase the size of the area to be etched by defocusing the beam but this reduces the incident power density per unit area. Whereas in contrast the present system can be scaled up using a large array of such devices which can cover a large processing area in accordance with the present method for surface modification without a significant cost penalty. Another advantage of the method utilizing the present exemplary apparatus is its portability which allows for field operations. A further advantage of this approach is its capability of having an optic fiber in the nozzle region to monitor the $CO_2$ emissions from the plasma region so as to be able to do end-point detection. Finally, the fact that the present system does not require a vacuum system makes it highly useful in many remote operations.

What is claimed:

1. A method of operating an atmospheric pressure plasma chamber for generating a cold plasma less than 100 C. comprising the steps of:

coupling an r.f. power supply through a coaxial transmission line to a tuning network for maintaining a stable r.f. plasma at atmospheric pressure;

coupling a gas manifold to the plasma chamber; and then increasing the r.f. power within the range of 2–60 watts from a predetermined value to increase the etch rate to produce a plasma in an oxygen mixture gas; exposing glass to the plasma to clean off organic residue from said glass.

* * * * *